United States Patent [19]

Ashton et al.

[11] Patent Number: 4,709,169

[45] Date of Patent: Nov. 24, 1987

[54] LOGIC LEVEL CONTROL FOR CURRENT SWITCH EMITTER FOLLOWER LOGIC

[75] Inventors: Gerard J. Ashton; Joseph R. Cavaliere, both of Hopewell Junction; Ming T. Cheng, Wappingers Falls, all of N.Y.

[73] Assignee: International Business Machines Corporation, Armonk, N.Y.

[21] Appl. No.: 902,711

[22] Filed: Sep. 2, 1986

[51] Int. Cl.$^4$ ............... H03K 19/013; H03K 19/086; H03K 17/10; H03K 19/092

[52] U.S. Cl. ................... 307/455; 307/467; 307/356; 307/359; 307/363; 307/296 R

[58] Field of Search .............. 307/455, 299 A, 296 R, 307/354, 355, 356, 357, 358, 359, 360, 362, 363, 280, 300, 467

[56] References Cited

U.S. PATENT DOCUMENTS

| | | | |
|---|---|---|---|
| 3,501,647 | 3/1970 | DiGiacomo | 307/455 |
| 3,579,272 | 5/1971 | Foss | 307/455 |
| 3,668,440 | 6/1972 | Davis | 307/310 |
| 3,678,292 | 7/1972 | Hampel | 307/455 |
| 4,276,488 | 6/1981 | Benedict et al. | 307/455 X |
| 4,490,630 | 12/1984 | Freeman | 307/455 |
| 4,540,900 | 9/1985 | Early | 307/289 |
| 4,575,647 | 3/1986 | Ashton et al. | 307/455 X |
| 4,626,709 | 12/1986 | Mazumder et al. | 307/455 |
| 4,670,673 | 6/1987 | Varadarajan | 307/455 |
| 4,675,553 | 6/1987 | Price et al. | 307/455 |

OTHER PUBLICATIONS

Malaviya, "Regulated On-14 Chip Reference Generator for Logic Families", IBM Tech. Discl. Bull., vol. 18, No. 5, pp. 1418-1419, Oct. 1975.

Primary Examiner—Stanley D. Miller
Assistant Examiner—David R. Bertelson
Attorney, Agent, or Firm—William T. Ellis

[57] ABSTRACT

A logic circuit network with circuitry for independently controlling at least one of the logic levels generated thereby, comprising, in one embodiment, a logic circuit with an output current node, a complement output current node, and at least one input line, the circuit for generating an output voltage level at the output current node which depends on the amount of current drawn therethrough, and for generating a complement output voltage level at the complement output current node which depends on the amount of current drawn therethrough; in combination with a current drawing means for drawing a controlled amount of current through one of those nodes to adjust the voltage level at that node. In one embodiment, this current drawing means is connected to a voltage reference level $V_{R1}$, and operates to draw an amount of current from whichever current node is at a voltage level which is closest to a predetermined constant plus this voltage reference level $V_{R1}$. The amount of current drawn is controlled to cause this closest node voltage level to approach this predetermined constant plus $V_{R1}$. In a preferred embodiment this current drawing means comprises a separate differential amplifier connected to each of the output current nodes.

21 Claims, 2 Drawing Figures

LOGIC LEVEL CONTROL FOR CURRENT SWITCH EMITTER FOLLOWER LOGIC

DESCRIPTION

Background of Invention

The present invention relates generally to logic circuit networks, and more particularly to a circuit and method for independently controlling one or more of the logic levels in the logic circuit network while reducing circuit switching delay.

Logic circuits for producing one or more prescribed logic levels in response to circuit input signals are well known. For logic networks using one or more of such logic circuits, it is imperative that the prescribed logic levels generated by each circuit be standardized to permit viable communication between the various logic circuits. Without such level control, an UP level for example in one logic circuit, may be read as a DOWN level by an adjacent logic circuit. However, logic levels tend to vary from logic chip to logic chip due to variations in the power supply voltage applied to the chip, due to differences among chips such as differences in resistor values and the like, and due to temperature variations between different chip locations in the network.

One standard logic circuit which is especially susceptible to such logic level variation is the current switch emitter-follower (CSEF) logic circuit, also known as emitted coupled logic. A typical prior art CSEF circuit is disclosed in FIG. 1 of U.S. Pat. No. 4,575,647. This CSEF circuit comprises a set of input transistors connected in a differential amplifier configuration with a reference transistor. The emitters of these transistors are coupled to a common current source. The collectors of the input transistors are connected through a first resistor to a power supply VCC, while the collector of the reference transistor is connected through a second resistor to the power supply VCC. A first emitter follower circuit is connected to the collectors of the input transistors to provide a first logic level, while a second emitter follower circuit is connected to the collector of the reference transistor to provide a complement logic output.

In operation, when at least one of the input signals applied to the base of the input transistors is at an UP level, its corresponding transistor is turned on, thereby causing most of the current that flows through the common current source to flow through that input transistor and its first resistor. This current flow causes a voltage drop at the collector of the input transistor, which voltage level is shifted by the first emitter follower circuit to provide the logical NOR output. The reference transistor is turned off by the current flow in the input transistor, thus eliminating the voltage drop through the connected second resistor. Accordingly, the voltage at the collector of the reference transistor is at an UP level. The UP voltage level is shifted by the second emitter follower circuit to provide the logical OR output.

The '647 patent utilizes a specially designed circuit to control the current through the common current source to thereby control the voltage drop through the resistor drawing current, and thus control the DOWN logic level. A pair of cross-connected Schottky diode disposed between the collectors of the input transistors and the collector of the reference transistor set the UP level to be approximately one Schottky diode drop above the DOWN level plus a resistance voltage drop.

The use of these cross-connected Schottky diodes to set the UP level has a number of drawbacks. First, many Schottky diode fabrication processes do not yield accurate repeatable Schottky barriers, resulting in UP level variations from chip to chip. More importantly, the Schottky barrier diodes have a predetermined capacitance which causes a considerable increase in switching delay because they are coupled in the critical switching area between the collectors of the transistor switching circuit. Additionally, the minimum voltage swing between the UP and the DOWN levels cannot be lower than approximately the minimum Schottky diode forward voltage drop. This limitation also impacts the switching delay because larger voltage swings between the UP and the DOWN levels require longer switching times.

The invention is intended to remedy the above-described problems in controlling logic levels.

The advantages offered by the present invention are that higher speed switching can be obtained in conjunction with the accurate and independent control of the voltage logic levels in the logic circuit. In one embodiment, the UP level may be compensated for variations in temperature and in the power supply, while independent UP level adjustment is used to permit control of the amount of voltage swing between the UP and the DOWN levels.

SUMMARY OF THE INVENTION

Briefly, the present invention comprises a logic circuit network for producing both a first logic level and a different adjustable second logic level in response to at least one input signal, comprising: a logic circuit with an output current node, a complement output current node, and at least one input line, with the logic circuit for generating an output voltage level at the output current node which depends on the amount of current drawn through the output current node, and for generating a complement output voltage level at the complement output current node which depends on the amount of current drawn through the complement output current node; and means connected to a voltage reference level $V_{R1}$, with this means for drawing an amount of current from whichever of the output current node or the complement current node has a voltage level V which is closest to a predetermined constant plus the voltage reference $V_{R1}$, and wherein the amount of current drawn by the current drawing means is sufficient to cause the closest voltage level V to approach the predetermined constant plus the voltage reference level $V_{R1}$.

In a preferred embodiment of the present invention, the current drawing means comprises a first differential amplifier circuit connected to the output current node and having a reference side thereof connected to the voltage reference level $V_{R1}$; and a second differential amplifier circuit connected to the complement output current node and having a reference side thereof connected to the voltage reference level $V_{R1}$.

In yet a further embodiment of the present invention, this current drawing means may comprise a first voltage level shifting circuit for shifting the output voltage level at the output current node; wherein the first differential amplifier circuit includes an input side for drawing current from the output current node; a second voltage level shifting circuit for shifting the complement output voltage level at the complement output current node;

and wherein the second differential amplifier circuit includes an input side for drawing current from the complement output current node.

In one implementation of this preferred embodiment of the present invention, the first differential amplifier circuit may comprise a first transistor with its control input connected to the shifted voltage level output of the first voltage level shifting circuit, and with one end thereof connected to the output current node and with the other end thereof connected to a common current source, and a reference transistor differentially coupled thereto with its control input connected to the voltage reference level $V_{R1}$ and with one end thereof connected to the common current source. The second differential amplifier may comprise a first transistor with its control input connected to the shifted voltage level output of the second voltage level shifting circuit, and with one end thereof connected to the complement output current node and with the other end thereof connected to the common current source, and a reference transistor differentially coupled thereto with its control input connected to the voltage reference level $V_{R1}$ and with one end thereof connected to the common current source.

In a preferred embodiment of the present invention, the reference voltage level $V_{R1}$ is generated such that it differs from a reference voltage level $V_{R0}$ in the logic circuit itself by a constant amount.

The present invention further includes a method for producing both a first logic level and a compensated second logic level in response to at least one input signal, comprising the steps of; generating an output voltage level at an output current node which depends on the amount of current drawn through the output current node and also generating a complement output voltage level at a complement output current node which depends on the amount of current drawn through the complement output current node; and drawing an amount of current from whichever of the output current node or the complement output current node has a voltage level which is closest to a predetermined constant plus a voltage reference level $V_{R1}$, wherein the amount of current drawn is sufficient to cause the closest voltage level to approach the predetermined constant plus a voltage reference level $V_{R1}$.

DETAILED DESCRIPTION OF THE PREFERRED EMBODIMENT

The present invention relates to a logic circuit network for producing logic levels in response to an input signal, and includes a circuit for independently adjusting at least one of those logic levels.

The present invention is designed to be used with a logic circuit with an output current node, a complement output current node, and at least one input line, with the logic circuit generating an output voltage level at the output current node which depends on the amount of current drawn through the output current node, and for generating a complement output voltage level at the complement output current node which depends on the amount of current drawn through the complement output current node. There are a wide variety of circuits which may be utilized to implement the above logic circuit. The present invention is not limited or restricted to any one of these circuit configurations.

Figure 1:
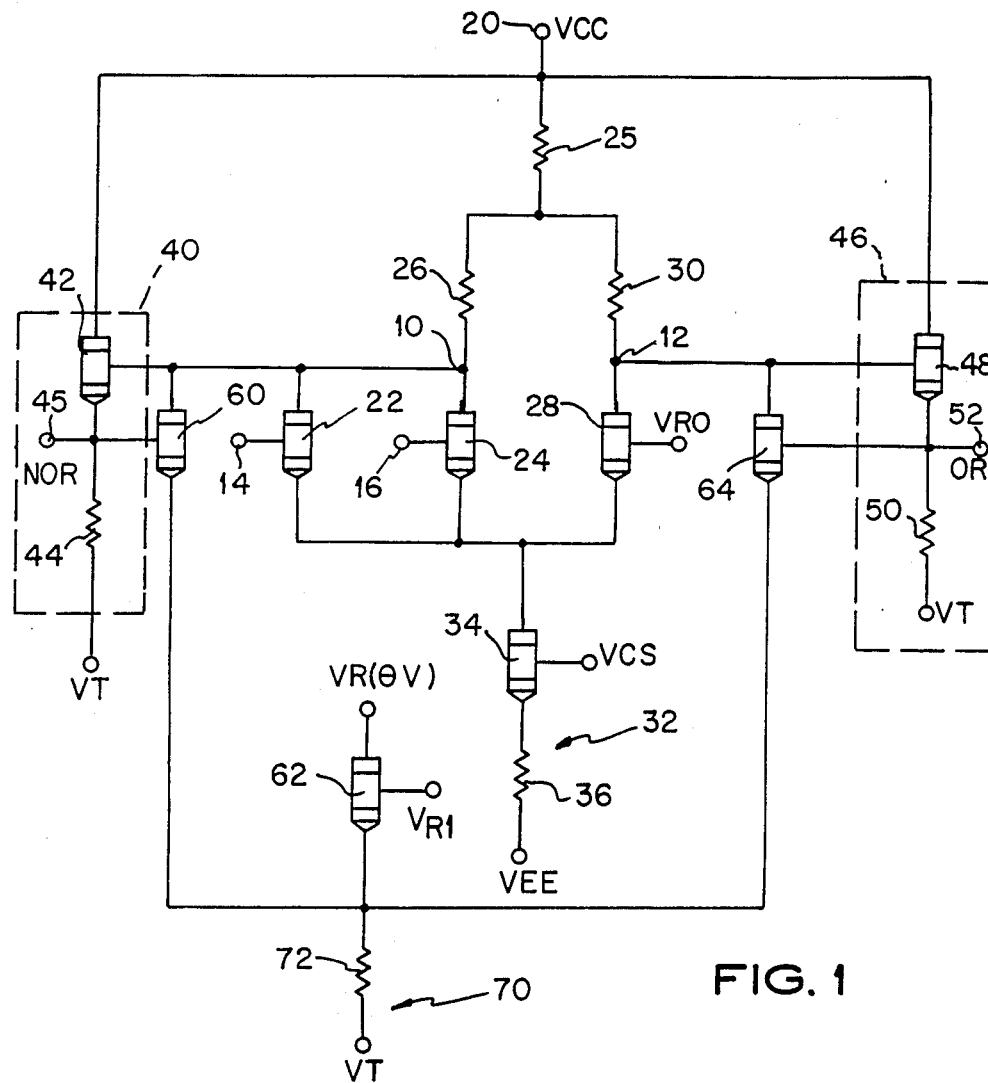
FIG. 1 is a schematic circuit diagram of one embodiment of the present invention.

A specific logic circuit configuration is set forth in FIG. 1 in order to illustrate the features and operation of the present invention. However, the present invention is not limited to this particular configuration.

Referring now to FIG. 1, a standard current switch emitter follower circuit is shown therein, including an output current node 10, a complement output current node 12, a first input line 14, and a second input line 16. The embodiment of FIG. 1 for implementing the above nodes comprises a voltage source 20, a first input transistor 22, with a first end connected to the output current node 10, a control input connected to the input line 14, and a second end, and a second input transistor 24 with a first end connected to the output current node 10, a control input connected to the second input line 16, and having a second end. A first resistance 26 is connected by way of a resistor 25 to the voltage source 20, and at its other end to the first end of the first and second input transistors 22 and 24. A reference transistor 28 is disposed with its first end connected to a complement output current node 12, with its control input connected to a reference voltage $V_{R0}$, and having a second end. A second resistance 30 is connected by way of resistor 25 to the voltage source 10, and at its other end to the first end of the reference transistor 28. A logic circuit current source 32 is connected to the second ends of the first and second input transistors 22 and 24 and to the second end of the reference transistor 28. In the embodiment shown in FIG. 1, this logic circuit current source 32 comprises a current source transistor 34 with a first end thereof connected to the second ends of the input transistors 14 and 16 and the reference transistor 28, with a control input thereof connected to a current source reference voltage $V_{cs}$, and with a second end thereof connected through a resistor 36 to a second voltage source VEE.

It can be seen from a review of the configuration of FIG. 1 that the input transistors 22 and 24 are connected in a differential amplifier configuration with the reference transistor 28.

In one embodiment, the present logic circuit may include a first voltage level shifting circuit 40 for shifting the output voltage level at the output current node 10, and a second voltage level shifting circuit 46 for shifting the complement output voltage level at the complement output current node 12.

In the circuit shown in FIG. 1, the above-described transistors have been implemented by NPN bipolar transistors. Accordingly, input signals are applied to the bases of the input transistors 22 and 24. The collectors of the input transistors 22 and 24 are connected to the resistor 26, while the emitters thereof are connected to the collector of the common current source transistor 34. Likewise, the collector of the reference transistor 28 is connected to the resistor 30, while its emitter is connected to the collector of the common current source, transistor 34. The base of the reference transistor 28 is connected to a convenient logic level voltage reference which may be ground potential. Note that the use of a $V_{R0}$ reference potential of ground permits the use of lower power, lower current terminations for the signal lines. Moreover, there is no need for a high quality positive power supply or for all of the chips to operate at the same temperature when ground potential is utilized. The first voltage level shifting circuit 40 in this embodiment is implemented by an NPN transistor 42 with its base connected to the output current node 10, with its collector connected to the voltage source 20, and with its emitter connected through a resistor 44 to a voltage source VT. Likewise, the second voltage level shifting circuit 46 is implemented by an NPN transistor 48 with its base connected to the complement output current node 12, with its collector connected to the voltage source 20, and with its emitter connected through a resistor 50 to the voltage source VT. This is the standard emitter-follower configuration for voltage level shifting. The emitter for the transistor 42 is connected to an NOR output terminal 45, while the emitter for the transistor 48 is connected to the OR output terminal 52.

In operation, when at least one of the input signals applied to the input terminals 14 and 16 is in the UP state, the corresponding transistor 14 or 16 is turned on, thereby causing most of the current which flows through the constant current source transistor 34 to flow through that respective input transistor 22 or 24 and through the resistor 26 up to the voltage source 20. This current flow through the resistors 25 and 26 causes a voltage drop at the output current node 10. The resulting voltage at the output current node 10 is a DOWN level voltage. The transistor 42 for the emitter-follower circuit 40 shifts this voltage level at the output current node 10 down by the base-emitter voltage drop $V_{BE}$. Accordingly, the output at the output line 45 is a voltage level shifted DOWN signal representing the logical NOR Function. Because of the differential circuit operation of the transistors 22, 24, and 28, when most of the current from the current source transistor 34 shifts to the input transistors, the reference transistor 28 shuts off. Accordingly, no current flows through the resistor 30 and the voltage level at the complement output current node 12 rises to an UP voltage level. This UP voltage level is applied to the base of the emitter-follower circuit transistor 48, which acts to drop this voltage level by the base-to-emitter voltage drop $V_{BE}$ of the transistor 48. Accordingly, the signal at the output terminal 52 is a voltage shifted UP signal representing the logical OR Function. The above-described operation is reversed if the input signals at the input terminals 14 and 16 are both low so that the input transistors 22 and 24 are not conducting. In that case, the reference transistor 28 is conducting so that the voltage level at the complement output node 12 will be a DOWN level, while the voltage level at the output current level 10 through which no current is being drawn, is at an UP level.

It can be seen that by controlling the common current source reference voltage $V_{CS}$ applied to the base of the transistor 34, the DOWN level may be controlled. This DOWN level control occurs because the regulation of the current through the common current source transistor 34 regulates the amount of current through either the resistor 26 or the resistor 30, and thus the voltage drop at the current node 10 or the current node 12, whichever node is drawing current therethrough.

The present invention comprises the combination of the above-described logic circuit with a specially-designed circuit connected to a voltage reference level $V_{R1}$, which specially-designed circuit draws an amount of current from whichever of the output current node 10 or the complement output current node 12 has a voltage level which is closest to a predetermined constant plus the voltage reference level $V_{R1}$. The amount of current drawn by this specially-designed current drawing circuit is set to cause the closest voltage level V to approach this predetermined constant plus the voltage reference level $V_{R1}$.

In one embodiment of this current drawing means, a first differential amplifier circuit is connected to the output current node 10, and having with a reference side thereof connected to the voltage reference level $V_{R1}$. Likewise, a second differential amplifier circuit is connected to the complement output current node 12 and has a reference side thereof connected to the voltage reference level $V_{R1}$. In the embodiment of FIG. 1, this first differential amplifier circuit comprises a first transistor 60 with its control input connected to the shifted voltage level output 45 of the first voltage level shifting circuit 40, and with one end of this first transistor 60 connected to the output current node 10 and with the other end thereof connected to a common current source 70. This first differential amplifier further includes a reference transistor 62 with its control input connected to the reference voltage $V_{R1}$, and with its first end connected to a voltage source, and with its second end connected to the common current source 70. Likewise, the second differential amplifier comprises a first transistor 64 with its control input connected to the OR output terminal 52, with one end thereof connected to the complement current output node 12, and with the other end thereof connected to the common current source 70. The second differential amplifier further includes a reference transistor with its control input connected to the voltage reference $V_{R1}$, and with its first end connected to a voltage source, and with its second end connected to the common current source 70.

In a preferred embodiment, these first and second differential amplifier circuits share a common current source and share a common reference transistor 62 connected to the voltage reference level $V_{R1}$. This common current source may simply be comprised of a resistor 72 connected to voltage source VT.

In the embodiment shown in FIG. 1, the transistors 60, 62 and 64 are implemented by NPN transistors. Accordingly, the base of the transistor 60 is connected to the NOR output terminal 45, while its collector is connected to the output current node 10, and its emitter is connected to the common current source 70. Likewise, the transistor 64 has its base connected to the OR output terminal 52, while its collector is connected to the complement output current node 12, and its emitter is connected to the constant current source 70. Finally, the transistor 62 has its base connected to the voltage level $V_{R1}$, its emitter connected to the common current source 70, and its collector connected to a suitable voltage source.

The present circuit operates as follows: the UP voltage level is set by setting or adjusting the voltage level $V_{R1}$ at the differential amplifier reference transistor 62. The differential amplifier connected to the output terminal which is at an UP level will act to force that output level to have the same voltage value as the voltage reference level $V_{R1}$. For example, assume that the OR output terminal 52 is at an UP level. Since the base of the differential amplifier transistor 64 is connected to this output terminal 52, then the transistor 64 conducts and forms a differential amplifier with the reference transistor 62. This transistor 64 draws enough current through the resistors 25 and 30 to make the OR output terminal 52 equal to the desired UP level set at the base of the reference transistor 62. For example, assume that the OR output terminal 52 has a voltage level which is too high relative to the reference voltage level $V_{R1}$. In this instance, since the voltage at the base of the transistor 64 is greater than the voltage at the base of the reference transistor 62, the transistor 64 draws more of the current from the constant current source 70 through the resistors 25 and 30. This increased current flow through the resistors 25 and 30 causes an increased voltage drop at the complement output current node 12. This lower voltage voltage level at the complement output current node 12 is shifted down in voltage by the $V_{BE}$ voltage drop of the emitter-follower transistor 48, and is applied to the base of the transistor 64 as the OR UP level. This lower base voltage at the transistor 64 decreases the amount of current flowing therethrough. This feedback operation between the emitter-follower circuit 46 and the transistor 64 continues until the voltage level at the OR output terminal 52 is equal to the $V_{R1}$ voltage level at the reference transistor 62.

Likewise, if the UP voltage level at the OR output terminal 52 becomes too low relative to the voltage reference $V_{R1}$, then more current is drawn from the constant current source 70 through the reference transistor 62, and less current is drawn through the resistors 25 and 30 and the transistor 64. This reduction in current drawn through the resistor 25 and 30 causes the voltage level at the complement output current node 12 to rise which, in turn, causes the UP level at the OR output terminal 52 to rise also. It can thus be seen that this differential amplifier comprising the transistor 62 and the transistor 64 operates in a negative feedback mode. Note that when the OR output terminal 52 is at an UP level, then the NOR terminal 45 is at a DOWN level. Accordingly, the transistor 60 is not conducting.

In the event that the NOR output terminal 45 is at an UP level, then the first differential amplifier formed by the transistors 60 and the reference transistor 62 in conjunction with the constant current source 70 begins to operate. This first differential amplifier likewise functions in a negative feedback mode to control the voltage level at the output current node 10 by either increasing or decreasing the amount of current drawn through the resistors 25 and 26 and through the transistor 60 until the UP voltage level at the output terminal 45 is equal to the reference voltage level $V_{R1}$ on the reference transistor 62. During this first differential amplifier operation, the first transistor 64 of the second differential amplifier is held off by the DOWN voltage level at the OR output terminal 52.

Figure 2:
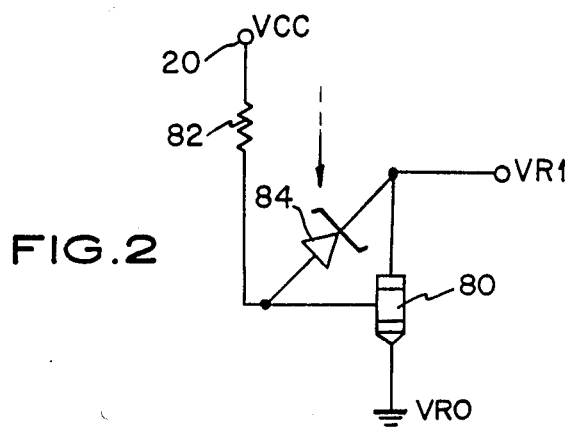
FIG. 2 is a schematic circuit diagram of one embodiment which may be utilized to generate the reference voltage $V_{R1}$ for the circuit of FIG. 1.

Referring now to FIG. 2, there is shown a circuit which may be utilized to generate the voltage reference $V_{R1}$ applied to the differential amplifier reference transistor 62. This circuit generates a voltage reference level $V_{R1}$ which is a prescribed amount above the logic circuit reference level $V_{R0}$ applied to the reference transistor 28. As noted previously, this reference voltage $V_{R0}$ may conveniently be set to ground potential and may be supplied from off-chip. In the circuit of FIG. 2, an NPN transistor 80 is disposed with its emitter connected to the logic circuit reference potential $V_{R0}$ and with its collector connected to the differential amplifier reference voltage terminal $V_{R1}$. The voltage source 20 is connected through a resistor 82 to the base terminal of the transistor 80, and is also connected to the collector of the transistor 80 through a Schottky barrier diode 84. The differential amplifier reference potential $V_{R1}$ thus differs from the logic circuit reference potential $V_{R0}$ by the base-emitter voltage drop $V_{BE}$ for the transistor 80 minus the voltage drop for the Schottky barrier diode, i.e., $V_{BE}-V_{SBD}$. The Schottky barrier diode 84 and the transistor 80 can be chosen so that the voltage drop $V_{BE}$ for the transistor and the voltage drop $V_{SBD}$ for the diode 84 have very similar temperature coefficients so that $V_{BE}-V_{SBD}$ are very stable, with a lower temperature coefficient than either the Schottky barrier diode or the transistor by itself. The voltage $V_{R1}$ may be adjusted simply by adjusting the junction sizes of the Schottky barrier diode 84 and the transistor 80.

It has been found through simulation that ringing is not a problem when current in the differential amplifier transistors 60, 62 and 64 is small compared to the current in the current switch (the transistors 22, 24, and 28). If ringing does occur in this circuit, it can be obviated simply by adding a resistor between the emitter and the constant current source 70 for each of the differential amplifier transistors 60, 62, and 64. These added resistors result in a lowered gain for the differential amplifier which prevents the ringing problem.

It can thus be seen that the appropriate differential amplifier circuit draws an amount of current from whichever of the output current node 10 or the complement output current node 12 has a voltage level V which is UP, i.e., which is closest to a predetermined constant plus a voltage reference level $V_{R1}$. Typically, the UP voltage level at the current nodes is equal to the voltage reference level $V_{R1}$ plus the voltage drop $V_{BE}$ for the emitter-follower transistor 42 or 48. Accordingly, the predetermined constant will be equal to $V_{BE}$ for transistor 42 or 48.

It should be noted that with the present circuit, there is no longer a need for stringent control of the voltage source VCC 20 because it is now possible to control both the UP and the DOWN logic levels. This feature is especially advantageous in high power environments where the regulation of the VCC power supply on-chip is very difficult.

The present circuit provides higher speed switching than can be obtained with standard Schottky diode UP level control. This is because the Schottky diodes with their predetermined capacitance have been eliminated from the collector switching circuits of the input transistors 22 and 24 and the reference transistor 28. It has been determined through simulation that approximately 20% less switching delay is obtained with the present design. Additionally, with the present circuit the UP level can be independently controlled. The minimum voltage swing between the UP and the DOWN level is not restricted to the Schottky diode forward voltage drop or greater. Accordingly, smaller voltage swings between the UP and the DOWN levels can be utilized with a resulting smaller switching delay. It should be noted that the present circuit is especially suited for adjusting the UP level in response to $V_{BE}$ changes caused by temperature variation. Additionally, the present circuit compensates for UP level variations caused by fan-out increases. In particular, it is known that current drawn from the output of the logic circuit increases as fan-out increases, thereby tending to lower the UP level. The present invention compensates for this UP level variation caused by the fan-out.

The present circuit is especially suited for logic chips where the reference voltage $V_{R0}$ for the logic chip is supplied from off-chip. The invention is intended for use as a logic circuit in high performance large and very large scale integrated circuits. The present circuit permits the operation of these chips at well-controlled small-signal swings and at signal levels which permit fast switching speeds and low delay sensitivity to wire capacitance.

Although the present invention has been described in the context of adjusting and/or controlling the UP level for a logic circuit, there are a variety of ways of defining an UP level. For example, if PNP transistors are utilized to implement the present invention, then the UP level may be the most negative level relative to the DOWN level.

While the present invention has been particularly shown and described with reference to preferred embodiments therefor, it will be understood by those skilled in the art that the foregoing and other changes in form and detail may be made therein without departing from the spirit and scope of the present invention.

We claim:

1. A logic circuit network for producing both a first logic level and a different adjustable second logic level in response to at least one input signal, comprising:
    a logic circuit with an output current node, a complement output current node, and at least one input line, said logic circuit for generating an output voltage level at said output current node which depends on the amount of current drawn through said output current node, and for generating a complement output voltage level at said complement output current node which depends on the amount of current drawn through said complement output current node; and
    means connected to a voltage reference level $V_{R1}$, said means for drawing an amount of current from whichever of said output current node or said complement output current node has a voltage level V which is closest to a predetermined constant, plus said voltage reference level $V_{R1}$, and wherein said amount of current drawn by said current drawing means is sufficient to cause said closest voltage level V to approach said predetermined constant plus said voltage reference level $V_{R1}$.

2. A logic circuit network as defined in claim 1, wherein said current drawing means comprises:
    a first differential amplifier circuit connected to said output current node and having a reference side thereof connected to said voltage reference level $V_{R1}$, and
    a second differential amplifier circuit connected to said complement output current node and having a reference side thereof connected to said voltage reference level $V_{R1}$.

3. A logic circuit network as defined in claim 2, wherein said first and second differential amplifier circuits share a common current source and a common reference side connected to said voltage reference level $V_{R1}$.

4. A logic circuit network as defined in claim 2, wherein said current drawing means comprises:
    a first voltage level shifting circuit for shifting the output voltage level at said output current node;
    wherein said first differential amplifier circuit includes an input side for drawing current from said output current node;
    a second voltage level shifting circuit for shifting the complement output voltage level at said complement output current node; and
    wherein said second differential amplifier circuit includes an input side for drawing current from said complement output current node; and
    wherein the input side of the differential amplifier connected to the shifted voltage which is closest to said voltage reference level $V_{R1}$ draws current from its respective current node.

5. A logic circuit network as defined in claim 4, wherein the input side of said first differential amplifier circuit comprises a first transistor with its control input connected to the shifted voltage level output of said first voltage level shifting circuit, and with one end thereof connected to said output current node and with the other end thereof connected to a current source;
    wherein the input side of said second differential amplifier circuit comprises a first transistor with its control input connected to the shifted voltage level output of said second voltage level shifting circuit, and with one end thereof connected to said complement output current node and with the other end thereof connected to said current source.

6. A logic circuit network as defined in claim 5, wherein said logic circuit comprises:
    a voltage source;
    at least one input transistor with a first end connected to said output current node, a control input connected to said input line, and a second end;
    a first resistance connected between said voltage source and the first end of said at least one input transistor;
    a reference transistor with a first end connected to said complement output current node, a control input connected to a second reference voltage $V_{R0}$, and a second end;
    a second resistance connected between said voltage source and the first end of said reference transistor; and
    a logic circuit current source connected to the second ends of said at least one input transistor and said reference transistor.

7. A logic circuit network as defined in claim 6, including means connected to said second reference voltage $V_{R0}$ for generating said reference voltage level $V_{R1}$ to differ from said second voltage level $V_{R0}$ by a constant amount.

8. A compensated current switch emitter follower device for producing both a first logic level and a compensated second logic level, in response to at least one input signal, comprising:
    a current switch emitter follower circuit including an output current node, a complement output current node, and at least one input line, for generating an output voltage level at said output current node which depends on the amount of current drawn through said output current node, and for generating a complement output voltage level at said complement output current node which depends on the amount of current drawn through said complement output current node, said current switch emitter follower circuit further including a first emitter follower circuit connected to said output current node for shifting said output voltage level to an output logic level, and a second emitter follower circuit connected to said complement output current node for shifting said complement output voltage level to a complement output logic level;
    feedback means connected to the outputs of said first and second emitter follower circuits and connected to a voltage reference level $V_{R1}$ for controlling the emitter follower circuit which has a voltage logic level $V_{EF}$ closest to the voltage reference level $V_{R1}$ so that said controlled voltage logic level $V_{EF}$ approaches the voltage reference level $V_{R1}$.

9. A device as defined in claim 8, wherein said feedback means comprises:
- a first differential amplifier circuit having a first side thereof connected to said output current node and having a reference side thereof connected to said voltage reference level $V_{R1}$; and
- a second differential amplifier circuit having a first side thereof connected to said complement output current node and having a reference side thereof connected to said voltage reference level $V_{R1}$.

10. A device as defined in claim 9, wherein said first and second differential amplifier circuits share a common current source and a common reference side connected to said voltage reference level $V_{R1}$.

11. A device as defined in claim 9, wherein said first side of said first differential amplifier circuit includes a first transistor with its base connected to the output of said first emitter follower circuit and with its collector connected for drawing current from said output current node; and
wherein said first side of said second differential amplifier circuit includes a first transistor with its base connected to the output of said second emitter follower circuit and with its collector connected for drawing current from said complement output current node.

12. A device as defined in claim 8, wherein said feedback means comprises:
- a first differential amplifier including a first transistor with its base connected to the shifted voltage level output of said first emitter follower circuit, with its collector connected to said output current node, and with its emitter connected to a common current source, and a reference transistor with its base connected to said voltage reference level $V_{R1}$ and with its emitter connected to said common current source; and
- a second differential amplifier circuit including a first transistor with its base connected to the shifted voltage level output of said second emitter follower circuit and with its collector connected to said complement output current node and with its emitter connected to said common current source, and a reference transistor with its base connected to said voltage reference level $V_{R1}$ and with its emitter connected to said common current source.

13. A device as defined in claim 12, wherein said first and second differential amplifier circuits share a common reference transistor.

14. A device as defined in claim 13, wherein said current switch emitter follower circuit comprises:
- a voltage source;
- a logic circuit current source;
- at least one input transistor with its collector connected to said output current node, its base connected to an input line, and its emitter connected to said logic circuit current source;
- a first resistance connected between said voltage source and the collector of said at least one input transistor;
- a reference transistor with its collector connected to said complement output current node, its base connected to a second reference voltage $V_{R0}$, and its emitter connected to said logic circuit current source; and
- a second resistance connected between said voltage source and the collector of said reference transistor.

15. A device as defined in claim 14, including means connected to said second reference voltage $V_{R0}$ for generating said reference voltage level $V_{R1}$ to differ from said second voltage level $V_{R0}$ by a constant amount.

16. A device as defined in claim 15, wherein said voltage logic level closest to said voltage reference level $V_{R1}$ is an UP level relative to said first logic level.

17. A device as defined in claim 8, wherein said voltage logic level closest to said voltage reference level $V_{R1}$ is an UP level relative to said first logic level.

18. A method for producing both a first logic level and a compensated second logic level in response to at least one input signal, comprising the steps of:
- generating an output voltage level at an output current node which depends on the amount of current drawn through the output current node and also generating a complement output voltage level at a complement output current node which depends on the amount of current drawn through the complement output current node; and
- drawing an amount of current from which ever of the output current node or the complement output current node has a voltage level which is closest to a predetermined constant plus a voltage reference level $V_{R1}$, wherein said amount of current drawn is sufficient to cause said closest voltage level to approach said predetermined constant plus said voltage reference level $V_{R1}$.

19. A method for producing both a first logic level and compensated second logic level in response to at least one input signal, comprising the steps of:
- generating an output voltage level at an output current node which depends on the amount of current drawn through the output current node and also generating a complement output voltage level at a complement output current node which depends on the amount of current drawn through the complement output current node; and
- shifting the output voltage level of the output current node to an output logic level, while shifting said complement output voltage level of the complement output current node to a complement output logic level;
- controlling the logic level in said level shifting step which is at an UP level closest to a voltage reference level $V_{R1}$ so that this controlled voltage logic level approaches said voltage reference level $V_{R1}$.

20. A method as defined in claim 19, wherein said logic level controlling step includes the step of drawing an amount of current from which ever of the output current node or the complement output current node has its shifted logic level closest to said voltage reference level $V_{R1}$ so that the voltage level at that current node changes sufficiently so that when it is level shifted in said voltage level shifting step, the controlled voltage logic level approaches said voltage reference level $V_{R1}$.

21. A method as defined in claim 19, comprising the step of generating the voltage reference level $V_{R1}$ so that it differs from a chip voltage level $V_{R0}$ by a constant amount.

* * * * *